(12) United States Patent
Johnson et al.

(10) Patent No.: US 7,126,164 B2
(45) Date of Patent: Oct. 24, 2006

(54) WAFER-LEVEL MOAT STRUCTURES

(75) Inventors: Michael E. Johnson, Tempe, AZ (US); Peter Elenius, Scottsdale, AZ (US); Deok Hoon Kim, Tempe, AZ (US)

(73) Assignee: FlipChip International LLC, Phoenix, AZ (US)

( * ) Notice: Subject to any disclaimer, the term of this patent is extended or adjusted under 35 U.S.C. 154(b) by 0 days.

(21) Appl. No.: 10/672,165

(22) Filed: Sep. 26, 2003

(65) Prior Publication Data

US 2005/0070083 A1    Mar. 31, 2005

(51) Int. Cl.
*H01L 33/00* (2006.01)
(52) U.S. Cl. ............................ 257/99; 438/15; 257/692
(58) Field of Classification Search ................ 438/612; 257/777
See application file for complete search history.

(56) References Cited

U.S. PATENT DOCUMENTS

| | | | | |
|---|---|---|---|---|
| 4,761,386 A | * | 8/1988 | Buynoski | |
| 6,287,893 B1 | | 9/2001 | Elenius et al. | ............... 438/108 |
| 6,296,552 B1 | * | 10/2001 | Boutaghou et al. | |
| 6,362,112 B1 | | 3/2002 | Hamerski | ................... 438/737 |
| 6,437,434 B1 | * | 8/2002 | Sugizaki | |
| 6,465,811 B1 | * | 10/2002 | Peters et al. | |
| 6,548,896 B1 | * | 4/2003 | Guida | |
| 6,548,897 B1 | | 4/2003 | Grigg | ......................... 257/737 |
| 6,578,755 B1 | | 6/2003 | Elenius et al. | .............. 228/254 |
| 2002/0195662 A1 | | 12/2002 | Eden et al. | .................. 257/349 |
| 2003/0008221 A1 | | 1/2003 | Tsai et al. | ...................... 430/5 |

* cited by examiner

*Primary Examiner*—Thao P. Le
(74) *Attorney, Agent, or Firm*—Greenberg Traurig LLP; Bruce T. Neel, Esq.

(57) ABSTRACT

A wafer-level CSP (200) includes at least one die (202) from a wafer. The wafer-level CSP has a plurality of solder ball pads (206), a solder ball (308) at each solder ball pad and a polymer collar (310) around each solder ball. A moat (204) is formed in the surface of a polymer layer (412) disposed on the wafer during manufacturing of the wafer-level CSP. A temporarily liquified residual (502) from the polymer collar, which occurs while the wafer is heated to the reflow temperature of the solder ball, flows from the polymer collar. The moat acts as a barrier to material flow, limiting the distance that the residual spreads while liquified. The residual from the polymer collar remains within a region (314) defined by the moat. A full-depth moat (312) extends completely through the polymer layer. Alternatively, a partial-depth moat (712 and 912) extends partially through the polymer layer. The abstract is submitted with the understanding that it will not be used to interpret or limit the scope or meaning of the claims pursuant to 37 C.F.R. §1.72(b).

24 Claims, 10 Drawing Sheets

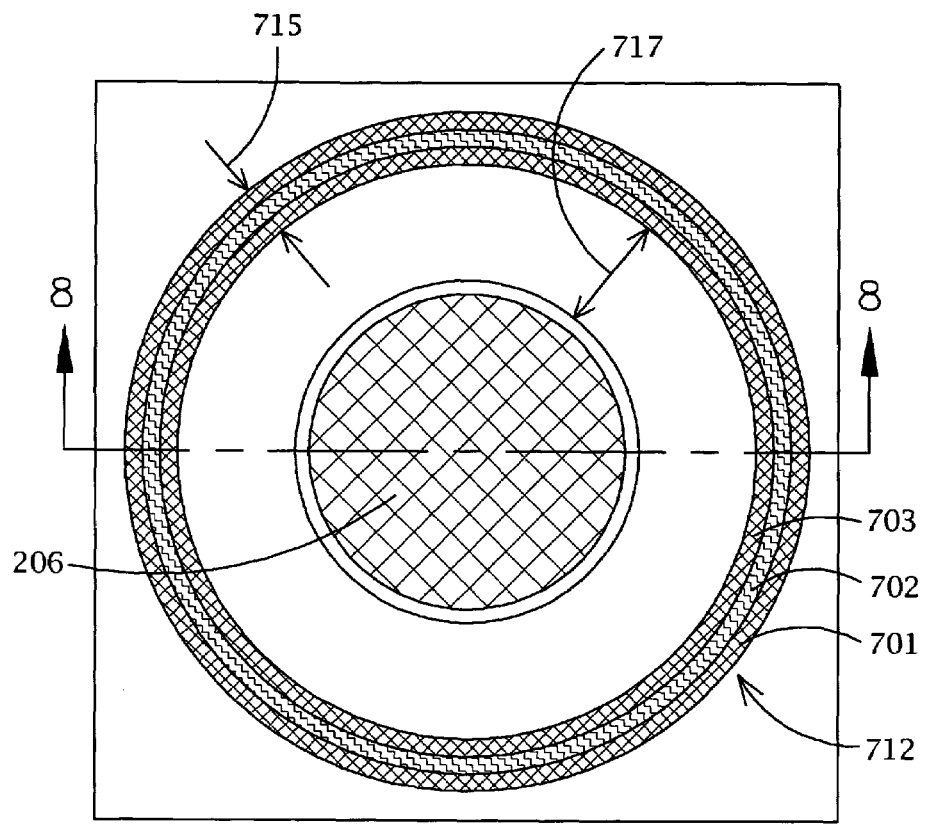
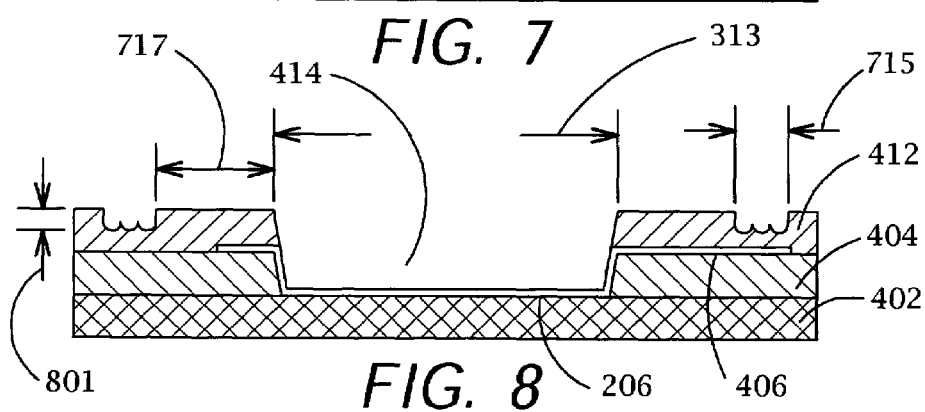

WAFER-LEVEL MOAT STRUCTURES

RELATED APPLICATION

This application is related to application having Ser. No. 10/672,201 entitled FORMING PARTIAL DEPTH STRUCTURES IN POLYMER FILM, filed on even date with this application, assigned to the same assignee as the assignee of this application, which is hereby fully incorporated herein by reference.

BACKGROUND OF THE INVENTION

1. Field of the Invention

This invention relates generally to wafer-level chip scale packages, and more particularly to forming a moat-like structure in a semiconductor wafer to restrict flow of a liquid prior to solidification of the liquid.

2. Description of the Related Art

A wafer-level chip scale package (CSP) is a package for an integrated circuit that is substantially the size of the integrated circuit or of a flip chip, which uses a wafer-level processing technique. Unlike a flip chip, the wafer-level CSP has one or more passivation layers on the active side of the die. Each passivation layer typically comprises a layer of photo-imageable polymer film. The wafer-level CSP is smaller than a standard ball grid array (BGA), typically uses metal traces of a re-distribution layer (RDL) to route solder ball pads to standard pitches, and uses CSP-size solder balls on the re-routed pads. A wafer-level CSP uses a standard surface mount technology assembly process that is also used for BGAs, and does not require underfill.

The use of a polymer collar around a solder ball, or solder bump, to support the solder ball in a wafer-level CSP is well known. When a semiconductor wafer, or wafer, is heated to the reflow temperature of the solder ball, some of the polymer collar material, which is very viscous at room temperature, becomes much less viscous, or liquefies. At times, the liquefied polymer collar material will disadvantageously flow farther from the solder ball than is desirable; occasionally merging with polymer collar material from an adjacent solder ball pad. Also, a solder ball disadvantageously tends to float on the liquefied polymer collar material. A solder ball will sometimes float to an adjacent solder ball pad, thereby creating a short. At times, a larger polymer collar is useful, but cannot be implemented with prior art wafer-level CSPs because a larger polymer collar would disadvantageously allow more liquefied polymer collar material to flow away from the polymer collar, thereby resulting in an undesirable appearance.

U.S. Pat. No. 6,437,434 entitled SEMICONDUCTOR DEVICE AND SEMICONDUCTOR DEVICE MOUNTING INTERCONNECTION BOARD, issued Aug. 20, 2002 to Sugizaki, discloses an interconnection board that has a moat etched in silicon around a BGA pad in order to release the BGA pad from stress. The moat is purposefully pre-filled with an elastomer. However, Sugizaki does not disclose a moat formed in a photo-imageable polymer film, does not disclose a moat on an integrated circuit, and does not disclose any means for stopping the spread of polymer collar material.

OBJECTS OF THE INVENTION

It is therefore an object of the present invention to provide a wafer-level CSP that overcomes the disadvantages of the prior art, and more particularly, to provide a wafer-level CSP that does not allow residual material from a polymer collar to flow beyond a predetermined distance from each solder ball.

It is another object of the present invention to provide a larger polymer collar without the detrimental effects of more polymer collar material flowing more than a predetermined distance from the solder ball.

It is still another object of the present invention to reduce any distance a solder ball can float on liquefied polymer collar residual material.

It is yet another object of the present invention to provide a wafer-level CSP with an enhanced cosmetic appearance.

These and other objects of the present invention will become apparent to those skilled in the art as the description thereof proceeds.

SUMMARY OF THE INVENTION

Briefly described, and in accordance with a preferred embodiment thereof, the present invention relates to a method of using a full-depth or partial-depth moat in a passivation polymer layer to confine or contain a subsequently applied liquid polymer material for cosmetic or structural purposes, prior to the liquid polymer material being cured into a solid.

Preferably, one aspect of the invention relates to a chip scale package of an integrated circuit, which includes at least one solder ball pad and a moat around each solder ball pad.

Another aspect of the present invention relates to a wafer for a chip scale package that has at least one solder ball pad. The wafer includes a solder ball at each solder ball pad, a polymer collar around the solder ball, and a moat around each solder ball pad.

A further aspect of the invention relates to a method of manufacturing a wafer-level chip scale package, comprising the steps of (a) providing a wafer, (b) disposing a passivation layer on the wafer; (c) forming, in the passivation layer, a central feature for a solder ball; and (d) forming, in the passivation layer, a moat around the central feature.

Other aspects, features and advantages of the present invention will become apparent to those skilled in the art from the following detailed description and the accompanying drawings. It should be understood however that the detailed description and specific examples, while indicating preferred embodiments of the present invention, are given by way of illustration only and various modifications may naturally be performed without deviating from the present invention.

BRIEF DESCRIPTION OF THE DRAWINGS

The present invention will be described with greater specificity and clarity with reference to the following drawings, in which:

FIG. 7 is a simplified top view of area B of the wafer used to form the wafer-level CSP shown in FIG. 2, showing a first embodiment of a partial-depth moat formed by a plurality of lines;

FIG. 8 is a cross-sectional view of FIG. 7 through cut-line 8—8;

Figure 1:
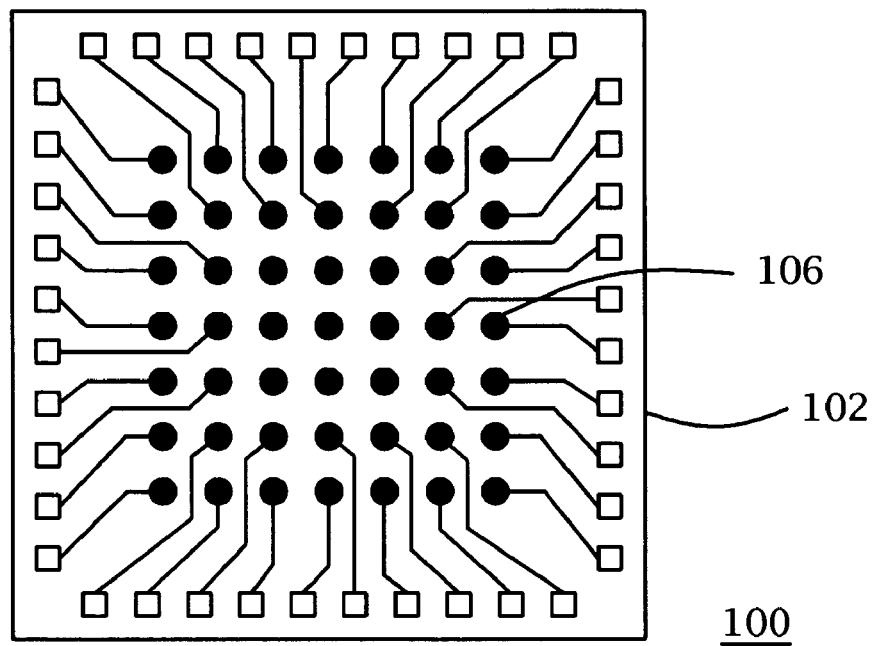
FIG. 1 is a top view of a simplified prior art wafer-level CSP.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale.

DESCRIPTION OF THE PREFERRED EMBODIMENT

It should be understood that the embodiments discussed below are only examples of the many advantageous uses of the innovative teachings herein. In general, statements made in the specification of the present application do not necessarily limit any of the various claimed inventions. Some statements may apply to some inventive features but not to others. In general, unless otherwise indicated, singular elements may be in the plural and vice versa with no loss of generality, for example, "one die", "two die". The terms first, second, third, and the like, in the description and in the claims, if any, are used for distinguishing between similar elements and not necessarily for describing a sequential or chronological order. The terms top, front, side, and the like, in the description and in the claims, if any, are used for descriptive purposes and not necessarily for describing relative positions. All measurements are approximate, for example, "30 microns" means "30 microns, more or less".

FIG. 1 is a top view of a simplified prior art wafer-level CSP 100 comprising a prior art integrated circuit, or die, 102 and a plurality of solder ball pads 106.

Figure 2:
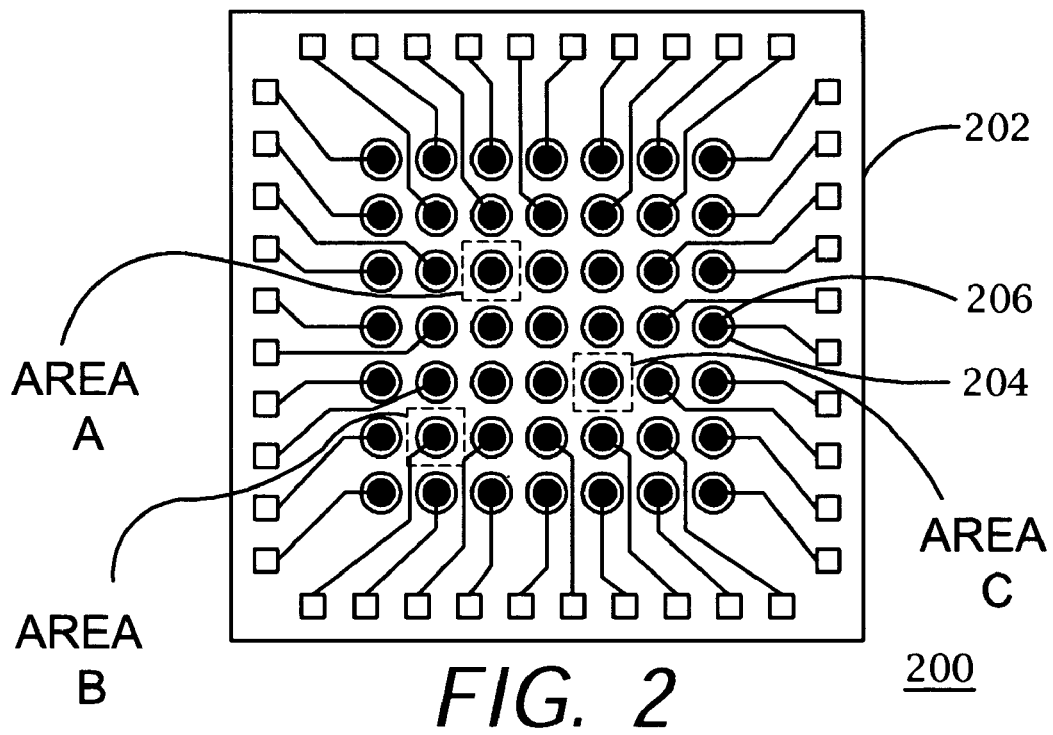
FIG. 2 is a top view of a simplified wafer-level CSP constructed in accordance with the preferred embodiments of the invention, showing a moat around each solder ball pad.

FIG. 2 is a top view of a simplified wafer-level CSP 200 constructed in accordance with the preferred embodiments of the invention, comprising a single integrated circuit, or die, 202 with a moat 204 around each solder ball pad 206. The die 202 is one of a plurality of die from a larger semiconductor wafer or "wafer" (not shown). Typically, there are 200–700 die per wafer. A wafer-level CSP design is described in U.S. Pat. No. 6,287,893 entitled METHOD FOR FORMING CHIP SCALE PACKAGE, issued Sep. 11, 2001, to Elenius et al., assigned to the assignee of the present invention, which is hereby fully incorporated herein by reference. The moat 204 is a ring-shaped (when seen in a top view) via formed in the surface of a passivation layer disposed on the wafer during a wafer-level processing step. By "wafer-level processing" it is meant, for example, that the moats 204 are formed in each die 202 prior to the die being cut from the wafer. Preferably, the passivation layer is a photo-imageable polymer film. The photo-imageable polymer film is typically benzocyclobutene (BCB), although the invention is useful with photo-imageable films of other materials. The moat 204 is used to confine and contain some material of the polymer collar that temporarily becomes much less viscous, or "liquefies", when the wafer is heated to the reflow temperature of solder ball metal during a subsequent wafer-level CSP 200 processing step.

Figure 3:
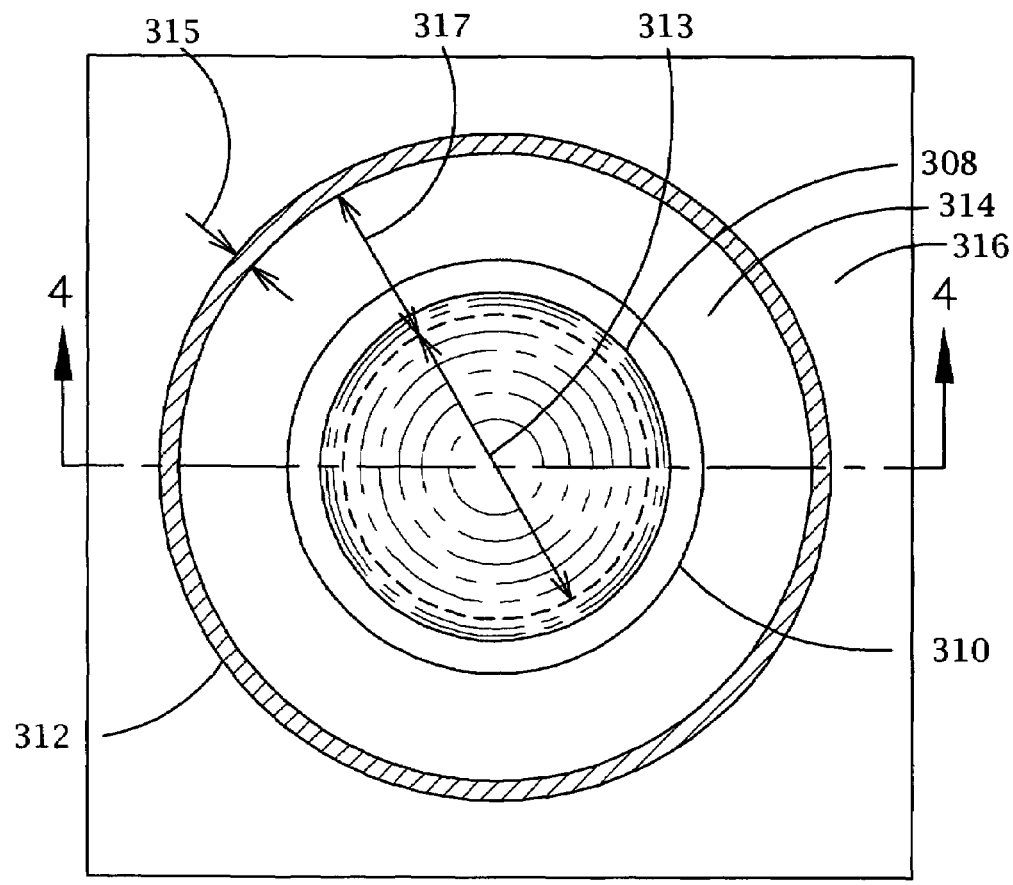
FIG. 3 is an enlarged simplified top view of area A of a wafer used to form the wafer-level CSP shown in FIG. 2, showing a solder ball with a polymer collar, surrounded by a full-depth moat, prior to heating of the wafer.

FIG. 3 is an enlarged simplified top view of portion 300, indicated by area A of FIG. 2, of a wafer used to form the wafer-level CSP 200, showing a solder ball 308 with a polymer collar 310 at a central feature 414 (see FIG. 4), surrounded by a full-depth moat 312, prior to heating of the wafer. Preferably, the polymer collar material is XNF-1502 manufactured by Ablestik Laboratories, of Rancho Dominguez, Calif. Alternatively, another material is used for the polymer collar 310. The use of a polymer collar around a solder ball is described in U.S. Pat. No. 6,578,755 entitled POLYMER COLLAR FOR SOLDER BUMPS, issued Jun. 17, 2003, to Elenius et al., assigned to the assignee of the present invention, which is hereby fully incorporated herein by reference. The central feature 414 has a diameter 313 of two hundred eighty (280) microns. The full-depth moat 312 defines a region 314 within the moat, and a region 316 without, or outside of, the moat. The full-depth moat 312 has a width 315 of thirty (30) microns. A distance 317 between the inside edge of full-depth moat 312 and the outside edge of the central feature 414 is seventy-five (75) microns. The solder ball 308 has a diameter 416 (see FIG. 4) of 300–350 microns.

Figure 4:
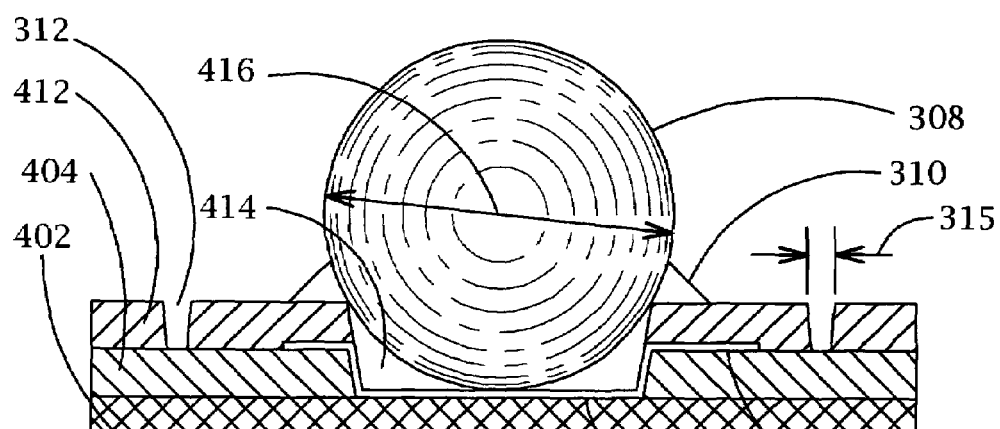
FIG. 4 is a cross-sectional view of FIG. 3 through cut-line 4—4.

FIG. 4 is a cross-sectional view of FIG. 3 through cut-line 4—4. The wafer typically comprises at least one layer of silicon, although the invention is also useful with wafers comprising other semiconductor materials. The one silicon layer 402 represents the wafer semiconductor substrate and all its layers, ready for CSP manufacturing. For simplification, the details of the wafer are not shown. The silicon layer 402 typically is coated with silicon nitride or silicon dioxide, dielectrics that generally do not conduct electricity, as a thin passivation layer (not shown), with openings over selected aluminum bond pads (not shown) of the integrated circuits of the wafer. The silicon nitride or silicon dioxide thin passivation layer is typically not placed on the wafer during CSP manufacturing, but is part of the wafer as it exists prior to CSP manufacturing. All other layers illustrated in FIG. 4 are typically placed on the wafer in the course of manufacturing the wafer-level CSP from the wafer.

A first polymer layer 404 of photo-imageable polymer film is disposed over the thin passivation layer. The first polymer layer 404 is typically 4–5 microns thick. A metalization layer is disposed on the first polymer layer 404, and over any exposed aluminum bond pads. The metalization layer includes an under bump metalization (UBM) area, or solder ball pad, 206 and a re-distribution layer (RDL) 406. The RDL comprises metal traces that form a conductive path between each solder ball pad 206 and any associated aluminum bond pad not positioned at the same x-y coordinates as the solder ball pad. A second polymer layer 412 of photo-imageable polymer film is disposed on the first polymer layer 404 and the metalization layer. The second polymer layer 412 is typically 4–5 microns thick. The first polymer layer 404 and the second polymer layer 412 are typically of the same material, preferably a CYCLOTENE™ 4022-35 BCB passivation polymer, manufactured by Dow Chemical Company of Midland, Mich., as in a standard, two-layer ULTRA CSP® package. Alternatively, another one material is used for both photo-imageable polymer layers. As a further alternative, different materials are used for each photo-imageable polymer layer. The full-depth moat 312 is also used on wafer-level CSPs 200 with a single polymer layer of 4–5 microns in thickness. Typically, when a single polymer layer is used, no RDL is necessary.

The central feature 414 is a via that penetrates completely through both the first polymer layer 404 and the second polymer layer 412 of a finished wafer-level CSP. Using photo-imaging means well known to those skilled in the art, the central feature 414 is formed (i.e., opened) in the first polymer layer 404 prior to deposition of the second polymer layer 412, thereby exposing any associated aluminum bond pad positioned at the same x-y coordinates as the solder ball pad 206. The silicon nitride or silicon dioxide thin passivation layer is exposed at the bottom of the central feature 414 in designs wherein the associated aluminum bond pad is not positioned at the same x-y coordinates as the solder ball pad 206. The first polymer layer 404 is then cured by baking in an oven at a temperature and for a period required for the polymer to polymerize. The metalization layer, which typically comprises layers of aluminum, nickel vanadium and copper, is sputtered over selected portions of the first polymer layer 404, over any exposed aluminum bond pads, and over the silicon nitride or silicon dioxide at the bottom of the central feature 414. Next, the second polymer layer 412 is disposed on the first polymer layer 404 including on the portions of the first polymer layer having metalization. Using photo-imaging means well known to those skilled in the art, full-depth moat 312 is formed in the wafer completely through the second polymer layer 412, and, at the same time, the central feature 414 is re-opened down to the metalization layer, or solder ball pad 206. The first polymer layer 404 is exposed at the bottom of full-depth moat 312. The full-depth moat 312 does not overlie the RDL 406, as shown in FIG. 4. Preferably, full-depth moat 312 is used in cases where the moat does not overlie the RDL 406.

Figure 5:
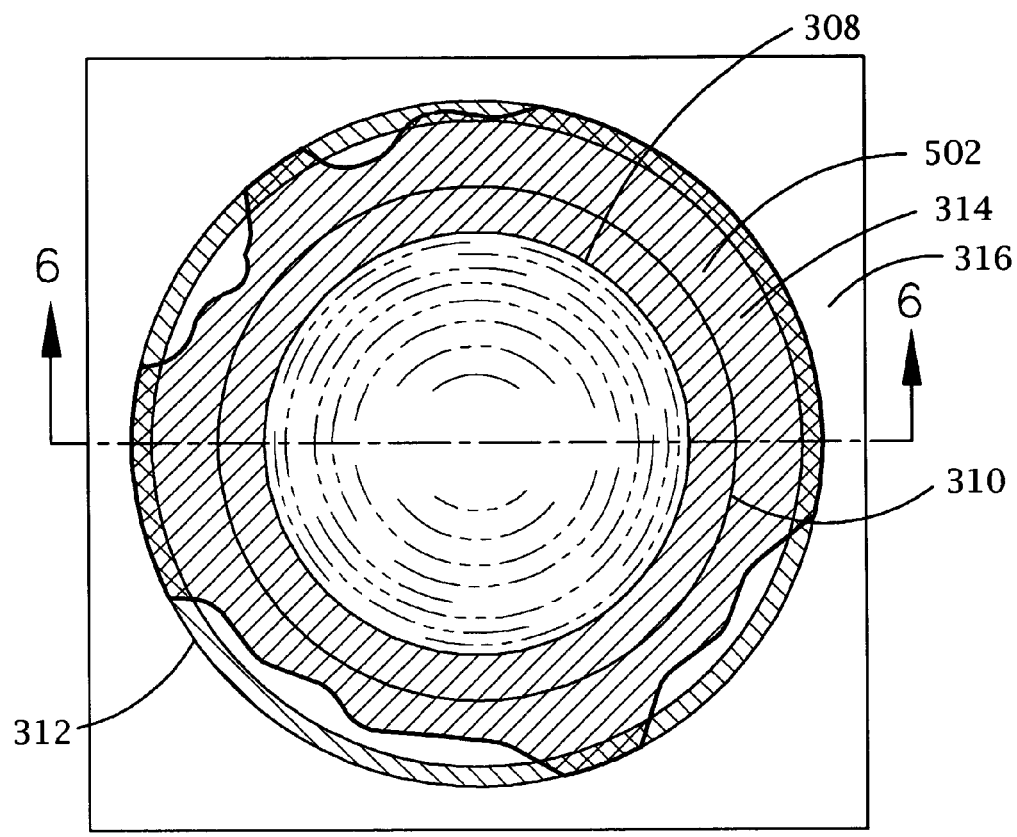
FIG. 5 is an enlarged simplified top view of area A of the wafer used to form the wafer-level CSP shown in FIG. 2, showing the solder ball with the polymer collar, surrounded by the full-depth moat, subsequent to heating of the wafer.

FIG. 5 is an enlarged simplified top view of the portion 300, showing the solder ball 308 with the polymer collar 310, surrounded by full-depth moat 312, subsequent to heating of the wafer. As the solder ball 308 is reflowed, some liquefied material of the polymer collar 310 spreads out, but advantageously, only into region 314 within full-depth moat 312. The full-depth moat 312 confines and contains the liquefied polymer collar material, and advantageously prevents it from spreading beyond the moat into region 316 outside the moat. During later stages of the reflow process, the liquefied polymer collar material that flowed into region 314 becomes much more viscous and hardens or "solidifies", and forms a residual 502. FIG. 5 shows that most of the region 314 within full-depth moat 312 contains residual 502 of polymer collar material. The residual 502 is semi-transparent. The residual 502 does not necessarily completely fill the region 314 within full-depth moat 312 (though it may), nor does it necessarily spread out equally in all directions from the main portion of the polymer collar 310 (though it may). Therefore, there might be some random-looking appearance of the residual material as FIG. 5, however, the residual 502 is contained/controlled by full-depth moat 312 and the spread of the residual therefore is limited by the moat. In some instances the residual 502 may completely cover the bottom surface of full-depth moat 312.

Figure 6:
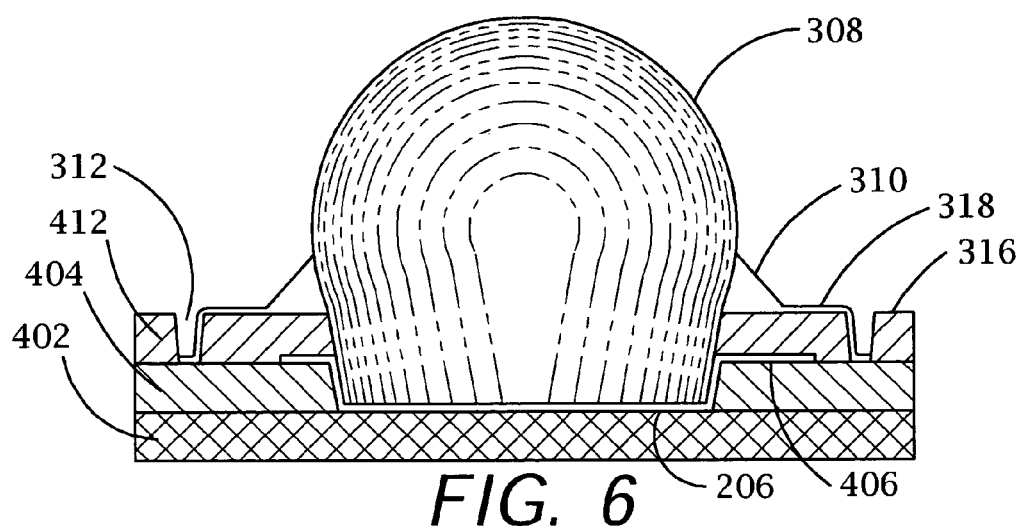
FIG. 6 is a cross-sectional view of FIG. 5 through cut-line 6—6.

FIG. 6 is a cross-sectional view of FIG. 5 through cut-line 6—6. The full-depth moat 312 retains residual 502 of polymer collar material that spreads out along the surface of the second polymer layer 412 away from the polymer collar 310. The flow of the residual 502 occurs prior to, and during solder reflow. Without the presence of full-depth moat 312, the residual 502 flows out in a random pattern and for a greater distance, and, as a result, is cosmetically unacceptable. The purpose of full-depth moat 312 is to contain the flow of the residual and prevent/minimize its flow beyond the moat, thereby enhancing the cosmetic appearance of the wafer-level CSP. As a result of the presence of full-depth moat 312, residual 502 flows a shorter distance from the polymer collar, the extent of residual flow is more nearly uniform in all directions, and the outer edge of the flow is thereby more nearly circular. The full-depth moat 312 surrounds the central feature 414; alternatively, the full-depth moat is a stand-alone feature.

FIG. 7 is a simplified top view of the portion 300, indicated by area B of FIG. 2, of the wafer used to form the wafer-level CSP 200, showing a first embodiment of a partial-depth moat 712 formed by a plurality of lines 701, 702 and 703 around the central feature 414, preferably using the photo-imaging means in accordance with the Related Application. The partial-depth moat 712 has a width 715 of twenty-three (23) microns. A distance 717 between the inside edge of partial-depth moat 712 and the outside edge of the central feature 414 is seventy-five (75) microns. It should be noted that the invention is not limited to using three (3) lines. Any number of lines greater than one (1) can be used.

FIG. 8 is a cross-sectional view of FIG. 7 through cut-line 8—8. Using means well known to those skilled in the art, the central feature 414 is formed completely through both the second polymer layer 412 and the first polymer layer 404. The solder ball pad 206 is exposed at the bottom of the central feature 414. The partial-depth moat 712 is formed in the wafer partially through the second polymer layer 412. The second polymer layer 412 is exposed at the bottom of partial-depth moat 712. The partial-depth moat 712 does not penetrate to the first polymer layer 404. The partial-depth moat 712 has a moat depth 801 of 1–99% of the thickness of the second polymer layer 412. Alternatively, the partial-depth moat 712 is used on wafer-level CSPs 200 having a single polymer layer of 4–5 microns in thickness. In such case, partial-depth moat 712 has a moat depth 801 of 1–99% of the thickness of the single polymer layer. In FIG. 8, the partial-depth moat 712 overlies the RDL 406. The RDL 406 is not exposed through partial-depth moat 712. Advantageously, the partial-depth moat 712 may cross underlying metal traces without exposing the RDL 406.

Figure 9:
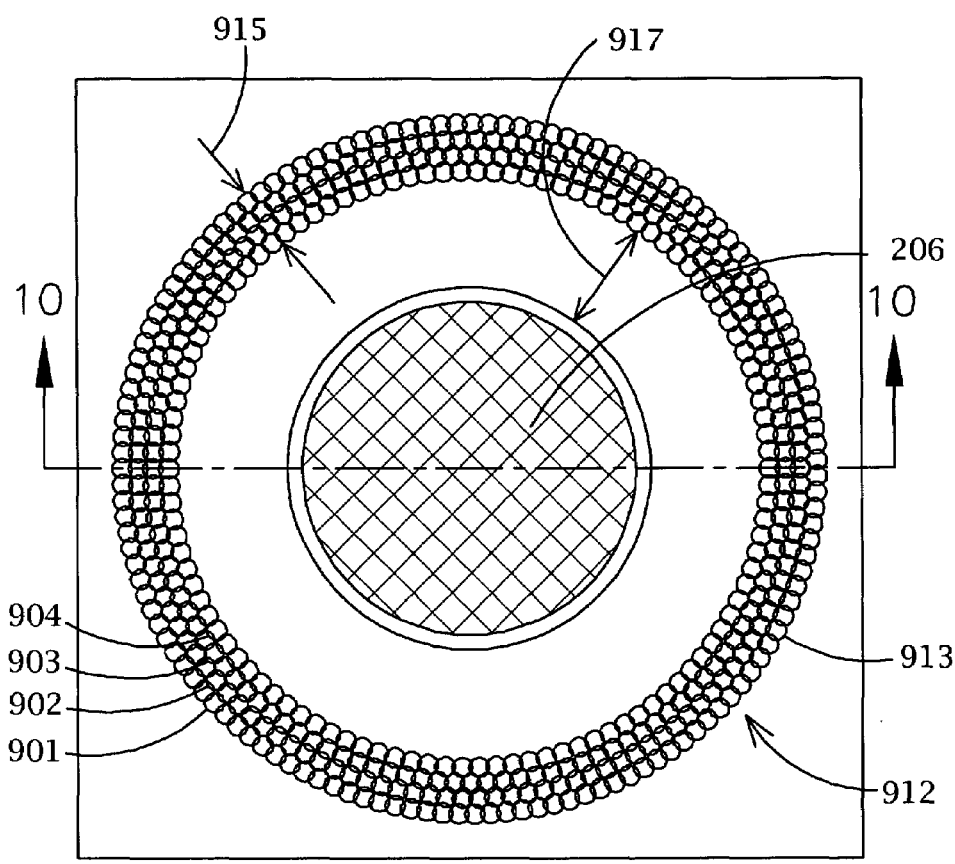
FIG. 9 is a simplified top view of area C of the wafer used to form the wafer-level CSP shown in FIG. 2, showing a second embodiment of the partial-depth moat formed by a multiplicity of circles.

FIG. 9 is a simplified top view of the portion 300, indicated by area C of FIG. 2, of the wafer used to form the wafer-level CSP 200, showing a second embodiment of the partial-depth moat. Partial-depth moat 912 is formed by a multiplicity of circles 913 around the central feature 414, preferably using photo-imaging means in accordance with the Related Application. The multiplicity of circles 913 are in the form of four (4) concentric rows 901–904 of closely-packed circles. The partial-depth moat 912 has a width 915 of twenty-eight (28) microns. A distance 917 between the inside edge of partial-depth moat 912 and the outside edge of the central feature 414 is seventy-five (75) microns. It should be noted that the invention is not limited to using four (4) concentric rows of circles. Any number of rows can be used, provided that there is a plurality of circles. Partial-depth moats 712 and 912 surround the central feature 414; alternatively, the partial-depth moats are stand-alone features.

Figure 10:
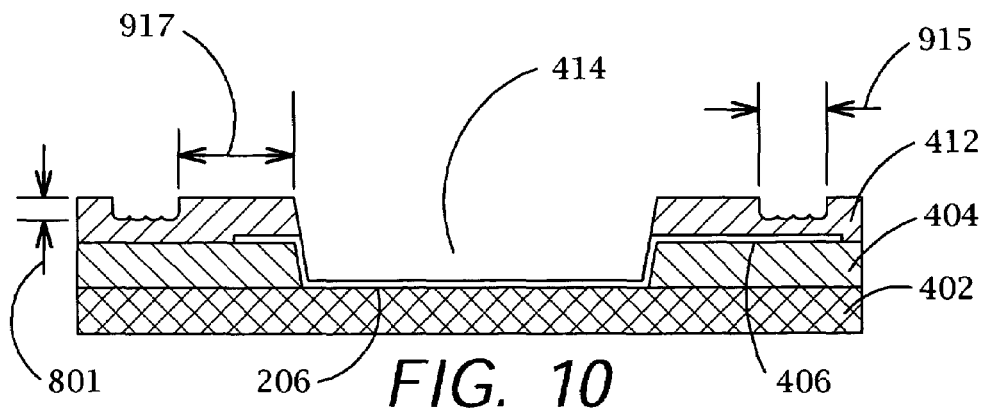
FIG. 10 is a cross-sectional view of FIG. 9 through cut-line 10—10.

FIG. 10 is a cross-sectional view of FIG. 9 through cut-line 10—10. Using means well known to those skilled in the art, the central feature 414 is formed in the wafer completely through both the second polymer layer 412 and the first polymer layer 404. The solder ball pad 206 is exposed at the bottom of the central feature 414. The partial-depth moat 912 is formed in the wafer partially through the second polymer layer 412. The partial-depth moat 912 does not penetrate to the first polymer layer 404, therefore, the second polymer layer 412 is exposed at the bottom of partial-depth moat 912. The moat depth 801 of partial-depth moat 912 is 1–99% of the thickness of the second polymer layer 412. Alternatively, the partial-depth moat 912 is used on wafer-level CSPs 200 having a single polymer layer of 4–5 microns in thickness. In such case, partial-depth moat 912 has a moat depth 801 of 1–99% of the thickness of the single polymer layer. The partial-depth moat 912 overlies the RDL 406. As shown in FIG. 10, the RDL 406 is not exposed through partial-depth moat 912. Advantageously, partial-depth moat 912 may cross underlying metal traces without exposing the RDL 406.

Figure 11:
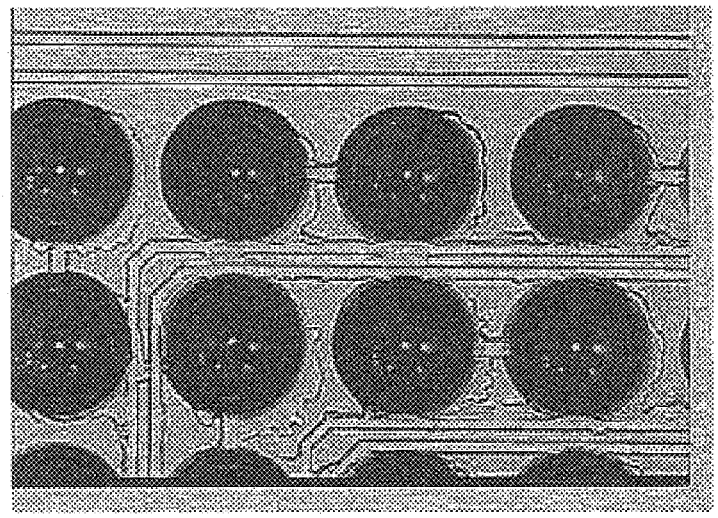
FIG. 11 is a photomicrograph of a portion of a prior art wafer showing the solder ball and the polymer collar following heating of the wafer.

FIG. 11 is a photomicrograph of a portion of a prior art wafer showing the solder ball 308 and the polymer collar 310 following heating of the wafer. The residue 502 of polymer collar material extends an irregular distance from the solder ball 308. After the central features 414 are formed in the wafer, a polymer collar 310, which is a fluxing polymer material, is applied to the central feature 414, and then solder balls 308 are placed onto the fluxing polymer spots. The wafer is subsequently processed through reflow and cure processes where the polymer collar 310 softens and has a tendency to flow, and then cure. As can be seen in FIG. 11, without the moats 204, the final appearance of the residual 502 is random and uncontrolled.

Figure 12:
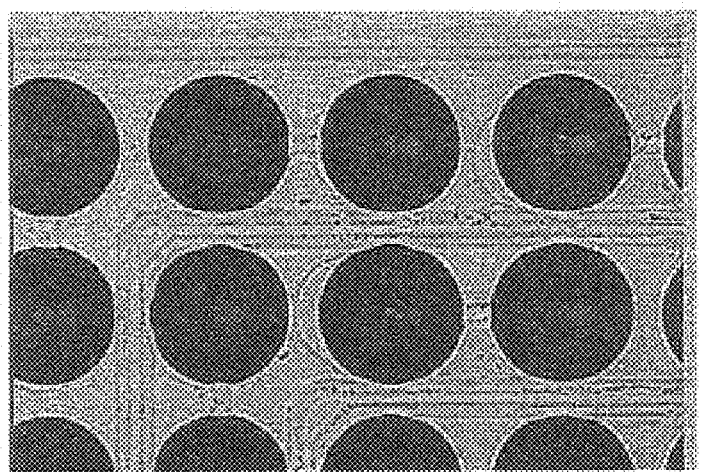
FIG. 12 is a photomicrograph of a portion of a wafer in accordance with the invention showing the solder ball and the polymer collar following heating of the wafer.

FIG. 12 is a photomicrograph of a portion of a wafer in accordance with the invention, showing the solder ball 308 and the polymer collar 310 following heating of the wafer. FIG. 12 illustrates the results of the same processing steps and materials used on the prior art wafer in FIG. 11, but with moats 204. FIG. 12 shows that the moat 204 confines and contains the residual 502 within the moat confines. The moat 204 assists in creating a concentric/uniformly shaped, cured fluxing polymer, and the moat inhibits random flow of the residual 502 from the polymer collar 310.

Figure 13:
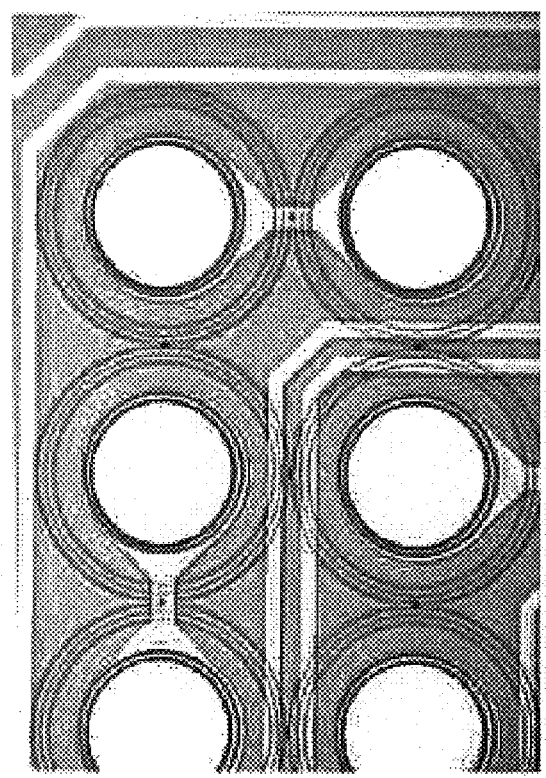
FIG. 13 is a photomicrograph of a portion of a wafer in accordance with the invention, showing the partial-depth moat formed by a plurality of lines around each solder ball pad.

FIG. 13 is a photomicrograph of a portion of a wafer in accordance with the invention, showing partial-depth moat 712 formed by the plurality of lines 701, 702 and 703 around each solder ball pad 206. There is no solder ball or polymer collar on the wafer shown in FIG. 13.

Figure 14:
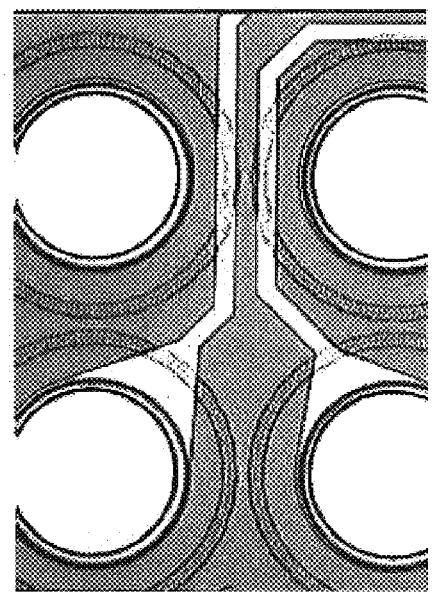
FIG. 14 is a photomicrograph of a portion of a wafer in accordance with the invention, showing the partial-depth moat formed by a multiplicity of circles around each solder ball pad.

FIG. 14 is a photomicrograph of a portion of a wafer in accordance with the invention, showing partial-depth moat 912 formed by a multiplicity of circles 913 around each solder ball pad 206. There is no solder ball or polymer collar on the wafer shown in FIG. 14.

Figure 15:
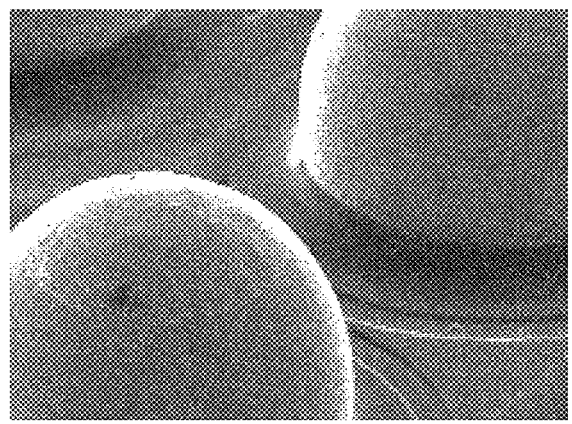
FIG. 15 is a photomicrograph of a portion of a wafer in accordance with the invention, with the partial-depth moat formed by a plurality of lines around each solder ball pad, showing the solder ball and the polymer support collar following heating of the wafer.
Figure 16:
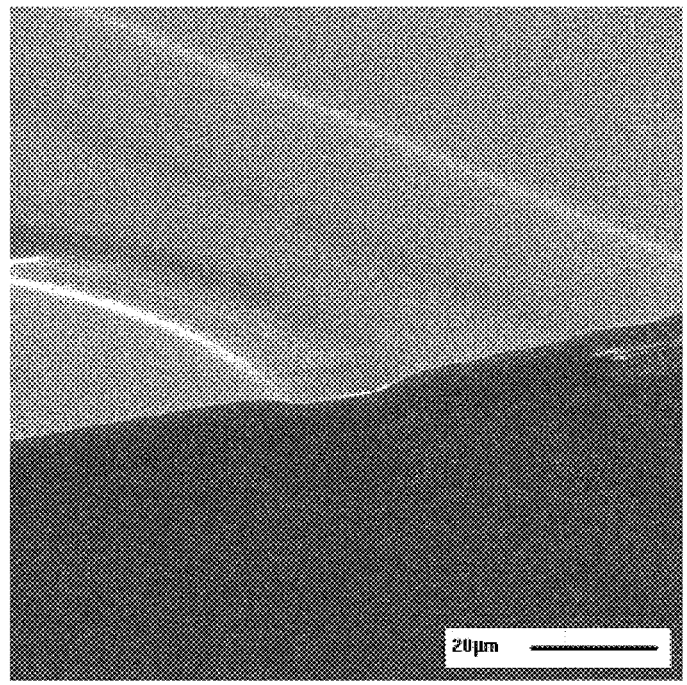
FIG. 16 is a photomicrograph of a cross-section of the partial-depth moat shown in FIG. 15.
Figure 17:
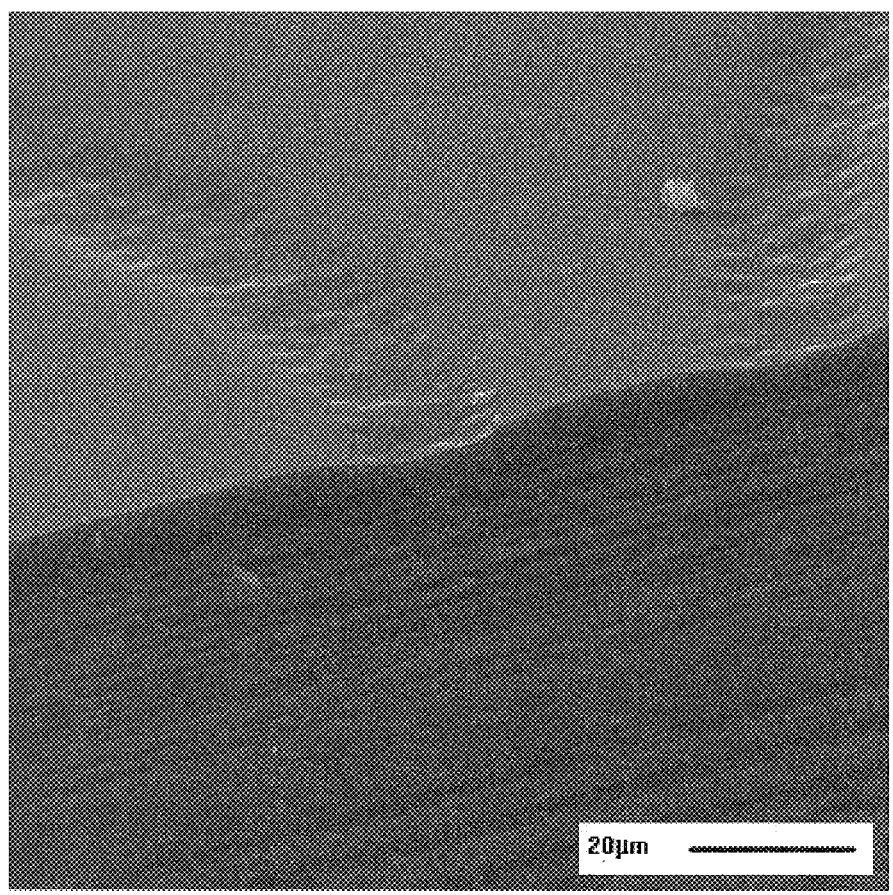
FIG. 17 is a photomicrograph of a cross-section of a wafer in accordance with the invention, with the partial-depth moat formed by a multiplicity of circles.

FIGS. 15–17 are photographs made with a scanning electron microscope. FIG. 15 is a photomicrograph of a portion of a wafer in accordance with the invention, with partial-depth moat 712 formed by the plurality of lines 701, 702 and 703 around the central feature 414, showing the solder ball 308 and the polymer collar 310 following heating of the wafer.

FIG. 16 is a photomicrograph of an enlarged cross-section of partial-depth moat 712 shown in FIG. 15. The partial-depth moat 712 shown in FIGS. 15 and 16 is produced by a photomask having three (3) concentric seven (7) micron wide chrome lines 701, 702 and 703 separated by one (1) micron wide spaces, using the method in accordance with the Related Application. Although produced by three lines, a single, partial-depth moat is formed, as shown in FIGS. 15 and 16. The partial-depth moat 712 of FIGS. 15 and 16 is twenty-three (23) microns wide and has a moat depth of 2.1 microns, which is about 60% through the second polymer layer 412.

FIG. 17 is a photomicrograph of a cross-section of a wafer in accordance with the invention, showing partial-depth moat 912 formed by a multiplicity of circles 913. The partial-depth moat 912 shown in FIG. 17 is produced by a photomask having four (4) rows of closely-packed seven (7) micron diameter chrome circles, using the method in accordance with the Related Application. Although produced by a multiplicity of circles, a single, partial-depth moat is formed, as shown in FIG. 17. The partial-depth moat 912 shown in FIG. 17 is twenty-eight (28) microns wide and has a moat depth of 2.2 microns, which is about 64% through the second polymer layer 412.

Figure 18:
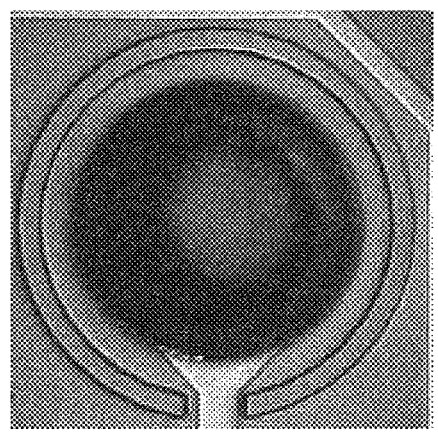
FIG. 18 is a photomicrograph of a portion of a wafer in accordance with the invention, showing the full-depth moat around the solder ball pad, and in which the full-depth moat is interrupted by a metal trace.

FIG. 18 is a photomicrograph of a portion of a wafer in accordance with the invention, showing full-depth moat 312 around the solder ball pad 206, and in which the full-depth moat is interrupted by a metal trace. One of the partial-depth moats 712 and 912 is preferably used where a moat overlies a metal trace. Alternatively, the full-depth moat 312 is used, and the full-depth moat is preferably interrupted at the metal trace, as shown in FIG. 18, so as not to expose the metal trace. As a further alternative (not shown), when exposing a particular metal trace is not deleterious, full-depth moat 312 crosses a metal trace, thereby exposing the RDL 406.

The invention advantageously keeps the applied material in a concentric shape/volume for either structural and/or cosmetic purposes. The ability of the moat 204, 312, 712 and 912 to confine the residual 502 depends upon the volume of the moat, the depth of the moat, and the distance 317, 717 and 917 from central feature 414. Advantageously, it is easier to perform automatic optical inspection of bumped wafers when the spread of the residual 502 is controlled by a moat.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims. For example, although the second polymer layer 412 is preferably photo-imageable, full-depth moat 312 and partial-depth-moats 712 and 912 are preferably formed used photo-lithographic means; alternatively, they are formed using other means, such as by using a laser or by mechanical means. Furthermore, the layer in which the moats 204 are formed can be of a material that is not photo-imageable. The shape of the moat 204 is not limited to being circular, but can be of any shape, including, for example, square. Furthermore, the invention is not limited to wafer-level CSPs, but can be extended to CSPs, in general.

| LIST OF REFERENCE NUMERALS | |
|---|---|
| 100 | Prior Art Wafer-Level CSP |
| 102 | Prior Art Die |
| 106 | Prior Art Solder Ball Pads |
| 200 | Wafer-Level CSP |
| 202 | Die |
| 204 | Moat |
| 206 | Solder Ball Pad |
| 300 | Portion of Wafer |
| 308 | Solder Ball |
| 310 | Polymer Collar |
| 312 | Full-depth Moat |
| 313 | Diameter of Central Feature |
| 314 | Region within Moat |
| 315 | Width of Full-Depth Moat |
| 316 | Region without Moat |
| 317 | Distance |
| 402 | Silicon |
| 404 | First Polymer Layer |
| 406 | Re-Distribution Layer (RDL) |
| 412 | Second Polymer Layer |
| 414 | Central Feature |
| 416 | Diameter of Solder Ball |
| 502 | Residual |
| 701–703 | Lines |
| 712 | Partial-Depth Moat |
| 715 | Width of Partial-Depth Moat |
| 717 | Distance |
| 801 | Moat Depth |
| 901–904 | Rows |
| 912 | Partial-Depth Moat |
| 913 | Multiplicity of Circles |
| 915 | Width of Partial-Depth Moat |
| 917 | Distance |

We claim:

1. A chip scale package of an integrated circuit, comprising:
   (a) at least one solder ball pad; and
   (b) a moat around each solder ball pad for containing liquefied material that flows to the moat, wherein the liquefied material is provided for forming around a solder ball on the solder ball pad.

2. The chip scale package of claim 1, in which at least one passivation layer is disposed on the integrated circuit, and in which the moat is formed in the at least one passivation layer.

3. The chip scale package of claim 2, in which the at least one passivation layer comprises a photo-imageable polymer film.

4. The chip scale package of claim 2, in which the at least one passivation layer has a thickness, and the moat is a full-depth moat having a thickness substantially equal to the thickness of the at least one passivation layer.

5. The chip scale package of claim 4, in which the at least one passivation layer comprises a photo-imageable polymer film.

6. The chip scale package of claim 2, in which the at least one passivation layer has a thickness, and the moat is a partial-depth moat having a thickness of approximately 1–99% of the thickness of the at least one passivation layer.

7. The chip scale package of claim 6, in which the at least one passivation layer comprises a photo-imageable polymer film.

8. The chip scale package of claim 1, in which a first passivation layer is disposed on the integrated circuit, and a second passivation layer, having a thickness, is disposed on the first passivation layer, and in which the moat is formed in the second passivation layer.

9. The chip scale package of claim 8, in which the moat is a full-depth moat having a moat depth substantially equal to the thickness of the second passivation layer.

10. The chip scale package of claim 9, in which at least the second passivation layer comprises a photo-imageable polymer film.

11. The chip scale package of claim 8, in which the moat is a partial-depth moat having a moat depth of approximately 1–99% the thickness of the second passivation layer.

12. The chip scale package of claim 11, in which at least the second passivation layer comprises a photo-imageable polymer film.

13. A wafer for a chip scale package, the wafer having at least one solder ball pad, comprising:
   (a) a solder ball at each solder ball pad;
   (b) a polymer collar around the solder ball; and
   (c) a moat around each solder ball pad.

14. The wafer of claim 13, such that the moat prevents flow of liquefied polymer collar from within the moat to without the moat during and subsequent to heating of the wafer.

15. The method of claim 2, in which the at least one passivation layer is an insulating layer.

16. The method of claim 13, in which the moat is positioned relative to the solder ball pad to contain liquefied material that may flow to the moat in a direction substantially away from the solder ball pad.

17. The method of claim 13, in which at least a portion of the polymer collar is positioned at a height, relative to the wafer, above the top of the moat.

18. The method of claim 13, in which the moat is formed in a passivation layer.

19. The method of claim 13, in which the moat is formed in an insulating layer.

20. A chip scale package of an integrated circuit, comprising:
   (a) at least one solder ball pad;
   (b) a moat around each solder ball pad;
   (c) a first passivation layer disposed on the integrated circuit; and
   (d) a second passivation layer disposed on the first passivation layer, wherein the moat is formed in the second passivation layer.

21. A chip scale package of an integrated circuit, comprising:
   (a) at least one solder bail pad;
   (b) a solder ball at each solder ball pad;
   (c) a collar around the solder ball; and
   (d) a moat around each solder ball pad for containing liquefied material from the collar that flows to the moat.

22. A chip scale package of an integrated circuit disposed in a semiconductor substrate, comprising:
(a) at least one solder ball pad;
(b) a moat around each solder ball pad; and
(c) at least one passivation layer disposed on the integrated circuit, wherein the moat is formed in the at least one passivation layer, but not in the semiconductor substrate.

23. The wafer of claim 14, such that the moat further prevents flow of liquefied polymer collar from within the moat to without the moat prior to heating of the wafer.

24. The chip scale package of claim 1 wherein the liquefied material is provided for forming a collar around the solder ball.

* * * * *